United States Patent [19]
Swart

[11] Patent Number: 5,807,063
[45] Date of Patent: Sep. 15, 1998

[54] CIRCUIT BOARD LOADING ASSEMBLY

[75] Inventor: Mark A. Swart, Anaheim Hills, Calif.

[73] Assignee: Delaware Capital Formation, Inc., Wilmington, Del.

[21] Appl. No.: 755,570

[22] Filed: Nov. 27, 1996

[51] Int. Cl.[6] .................................................. H05K 3/00
[52] U.S. Cl. ........................ 414/744.8; 901/36; 294/111
[58] Field of Search ................................... 294/104, 111, 294/19.1; 414/740, 744.2, 753, 744.3; 901/36, 39

[56] References Cited

U.S. PATENT DOCUMENTS

| | | | |
|---|---|---|---|
| 3,433,521 | 3/1969 | Lasko | 284/19.1 |
| 4,344,729 | 8/1982 | Orsinger et al. | 294/104 |
| 4,448,056 | 5/1984 | Baba | 414/753 |
| 4,634,107 | 1/1987 | Vandersdye et al. | 901/39 |
| 4,728,097 | 3/1988 | Vandersyde et al. | 294/104 |
| 4,767,146 | 8/1988 | Haase | 294/104 |
| 5,618,075 | 4/1997 | Baziuk et al. | 294/111 |
| 5,667,351 | 9/1997 | Tokairin et al. | 414/753 |

*Primary Examiner*—Janice L. Krizek
*Assistant Examiner*—Gregory A. Morse
*Attorney, Agent, or Firm*—Christie, Parker & Hale, LLP

[57] ABSTRACT

A printed circuit board loading assembly for loading a printed circuit board from a queueing station to an electronic test analyzer having an adjustable extrusion arm and a gripper assembly located at an end of the extrusion arm for engaging at least one edge of the printed circuit board. A clamping block is positioned along the length of the extrusion arm having a locking lever for adjustably positioning the length of the extrusion arm. A cable extends along the length of the extrusion arm and is connected to the gripper assembly which when tensioned actuates the gripper assembly between an open position and a closed or gripping position.

7 Claims, 4 Drawing Sheets

CIRCUIT BOARD LOADING ASSEMBLY

FIELD OF THE INVENTION

This invention relates to an apparatus for automatically placing a printed circuit board in a tester, and more particularly, to a gripper assembly for gripping the circuit board by one outer edge for movement between a queueing station and the tester.

BACKGROUND OF THE INVENTION

Automatic test equipment for testing printed circuit boards involves the use of a test fixture to which the circuit board is mounted in a testing apparatus during testing. Test fixtures typically include a large number of spring loaded test probes arranged to make electrical contact under spring pressure with designated test points on the circuit board under test. The circuit board is mounted in the fixture, superimposed on an array of test probes such that during testing the spring loaded test probes are brought into spring pressure contact with the test points on the circuit board under test. Electrical test signals are transferred from the board to the test probes and then to the exterior of the fixture for communication with a high speed electronic test analyzer which detects continuity or lack of continuity between various test points in the circuits on the board.

Any particular circuit laid out on printed circuit board is likely to be different from other circuits, and consequently, the test fixture arrangement for providing contact between test probes and test points in a particular circuit board must be customized for that circuit board. When the circuit to be tested is designed, a pattern of test points to be used in checking it are selected and a corresponding array of test probes are configured in the test fixture. With advancements in test fixtures and test analyzers, it is now becoming possible to reconfigure test fixtures so as to accommodate various sizes and types of circuit boards having different test points for testing within the same fixture and tester.

Presently, circuit boards are loaded into the test fixture and tester manually, one at a time, or automatically from a queueing station by a belt driven conveyor system. In presently available belt-driven conveyor systems, the circuit boards are loaded from the queueing station onto the belts for movement to the test site. Typical conveyor systems consist of two parallel belts spaced apart depending on the dimension of the printed circuit board such that two parallel outer edges of the board travel on a separate belt. A problem with this type of conveyor system, is that the belts need to be readjusted for each different size of circuit board to be tested, or a separate conveyor system must be provided for each different size of circuit board. Another problem associated with these conveyor systems is that they cannot transport irregularly shaped circuit boards between the queueing station and the tester because of the two belt arrangement. Yet another problem with the presently available conveyor systems is that since the circuit boards simply ride along the surface of the conveyor belts, light or thin circuit boards have a tendency to move or fall off the conveyor before reaching the tester.

Therefore, a need exists for an improved circuit board loading assembly capable of automatically and reliably loading a variety of sized and shaped circuit boards into the testing apparatus.

SUMMARY OF THE INVENTION

The invention comprises an adjustable circuit board loader for loading any size circuit board from a queueing station into a testing apparatus. The circuit board loader includes an adjustable extrusion arm having a gripper assembly positioned on the end of the arm for gripping a circuit board at one edge of the board. The gripper assembly is actuated between an open position and a closed or gripping position by a cable extending from the gripper assembly along the length of the extrusion alarm and through a set of pulleys positioned within a clamping block which also secures the extrusion arm in a fixed position. The clamping block includes a locking lever having a cammed surface for actuating the clamping block between a locked or clamped position and an open or released position. In the open position, the length of the extrusion arm can be adjusted.

An air cylinder, which is connected to a push rod, is positioned over the clamping block for adjusting the tension of the cable for actuating the gripper assembly. A plunger attached to the push rod includes a pulley positioned at its lower edge which extends into the clamping block so that when the air cylinder is actuated the pulley is directed downwardly between the pulley set in the clamping block. The plunger pushes on the cable to move the gripper assembly into the closed or gripping position. After the printed circuit board has been gripped and moved to the testing station, the air cylinder retracts the plunger thereby releasing the tension from the cable and opening the gripper assembly thereby releasing the printed circuit board.

These and other features and advantages of the present invention will be better understood with reference to the following detailed description and the accompanying drawings.

DETAILED DESCRIPTION

Figure 1:
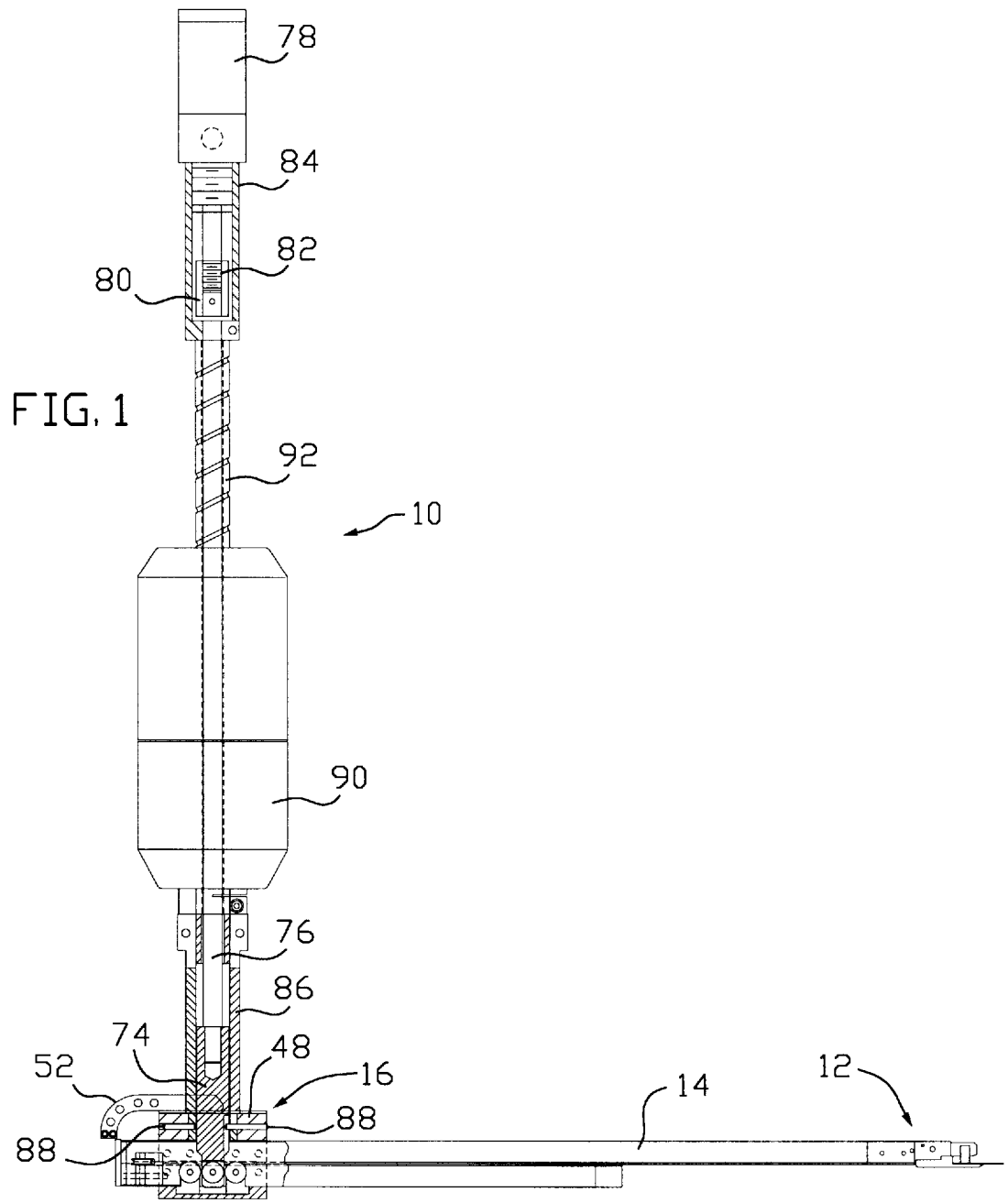
FIG. 1 is a cross sectional view of the printed circuit board loading apparatus of the present invention.

FIG. 1 illustrates a printed circuit board loading apparatus 10 in accordance with the principles of this invention. The loading apparatus includes a gripping assembly 12 for gripping a printed circuit board located at a queueing station (not shown) and loading the circuit board into an electronic tester (also not shown). The gripper assembly 12 is located at the end of an extrusion arm 14 which is adjustably fixed in position by a clamping block 16.

Figure 2:
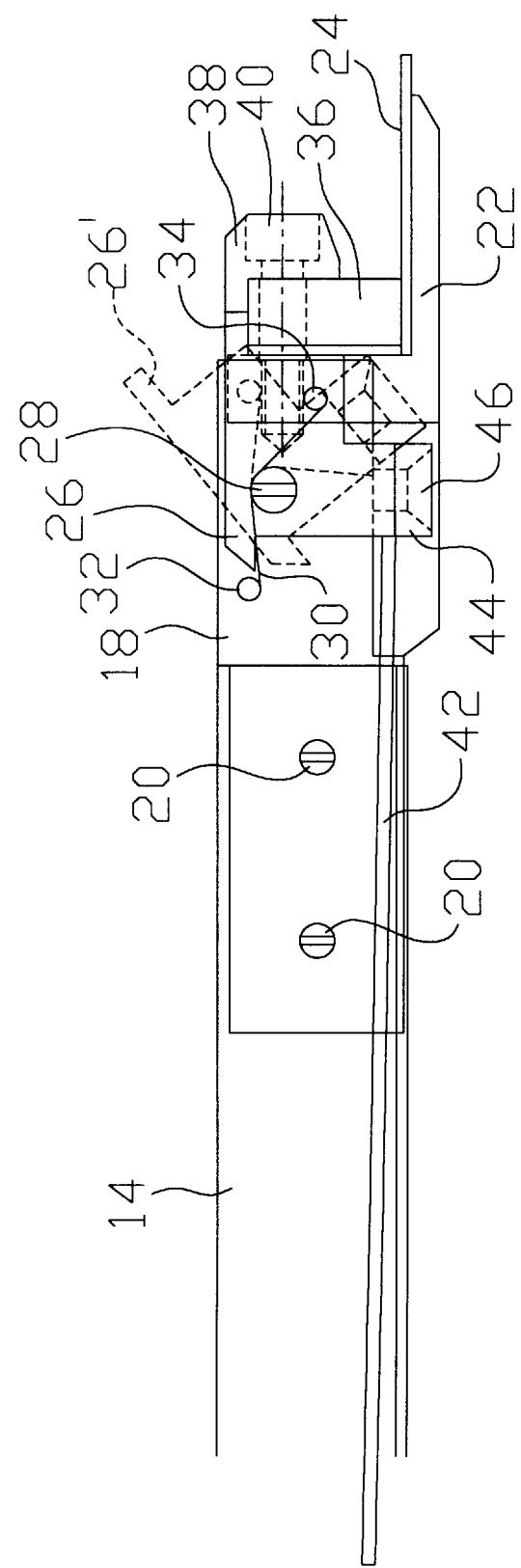
FIG. 2 is an enlarged detail of the gripper assembly of FIG. 1.

As seen best in FIG. 2, the gripper assembly includes a housing 18 which is rigidly attached to the end of extrusion arm 14 by screws 20. Attached to the lower front portion of the housing is a gripper shovel 22 for supporting a printed circuit board 24 during loading into the tester. A gripper pivot 26 is positioned within the housing 18 above the gripper shovel 22 by a capscrew 28. Gripper pivot 26 is normally held in a spring biased open position 26' by spring 30. Spring 30 is held in position within the housing by stud 32 located on the housing and stud 34 located on the gripper pivot. Positioned on the front surface of the gripper pivot is a polyurethane finger element 36 which, when the gripper pivot is actuated to its closed position, holds the printed circuit board 24 against the gripper shovel 22. Finger element 36 is positioned against the front surface of the gripper pivot 26 by a clamp 38 and capscrew 40.

The gripper pivot and finger element are actuated between their open position 26' and their closed or gripping position by a cable 42 rigidly connected to a lower portion of the gripper pivot by a cable clamp 44. Cable clamp 44 is rigidly connected to the lower surface of the gripper pivot by screw 46. The specific operation of cable 42 which extends along the length of extrusion arm 14 will be discussed in more detail subsequently herein.

Figure 3:
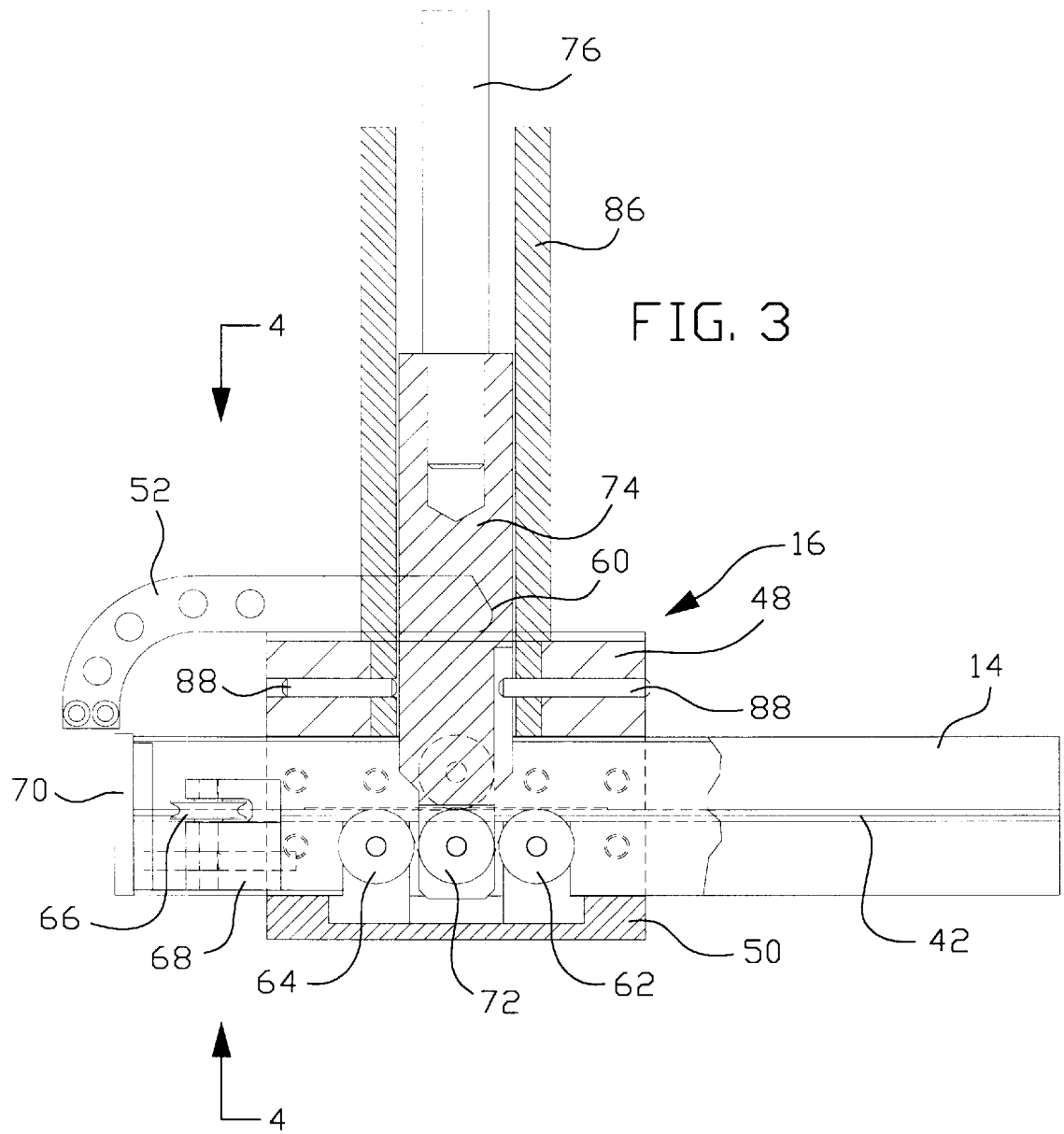
FIG. 3 is an enlarged detail of the clamping block of FIG. 1.
Figure 4:
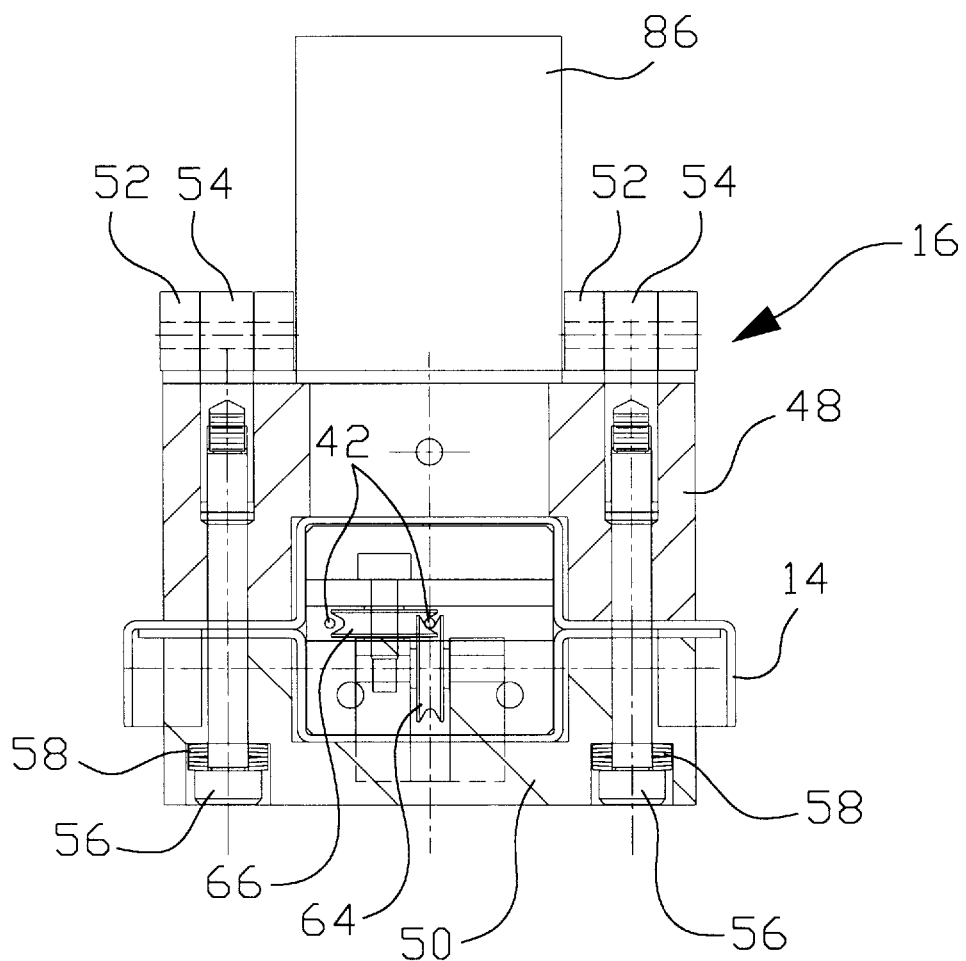
FIG. 4 is a cross sectional end view taken along line 4—4 of FIG. 3.

The extension length of extrusion arm 14 is adjustable by clamping block 16 as shown in FIGS. 3 and 4. The extrusion arm 14 passes through the clamping block 16 between an upper portion 48 and a lower portion 50. A generally U-shaped locking lever 52 is positioned on the upper surface of the clamping block 16 for drawing the upper portion and lower portion together to rigidly fix the position of the extrusion arm 14. Each leg portion of the locking lever is pinned to an anchor lever lock 54 extending downwardly through the upper portion 48 on either side of the clamping block 16. The anchor lever locks 54 are internally threaded to receive shoulder screws 56 extending upwardly through the upper and lower portions of the clamping block 16. A bellville washer 58 is located within a recess in the lower portion around each shoulder screw. When the locking lever 52 is moved to its downward position as shown in FIG. 3 the lever pulls the anchor lever locks and the shoulder screws upwards effectively clamping the extrusion arm 14 between the upper portion 48 and the lower portion 50. Lever 52 has a cammed front surface 60 so that the lever can be lifted upwardly thereby relieving the force on the anchor lever locks which releases the lower portion from the upper portion and allows the extension arm to be shifted horizontally to any desired position.

As briefly discussed above, the gripper assembly is actuated by cable 42. Cable 42 extends from the gripper assembly along the extrusion arm, into the clamping block 16 and through the channels of pulleys 62 and 64 which are pinned in the lower portion 50 of the clamping block. The cable continues to extend rearwardly out of the clamping block and around a horizontally oriented pulley 66 pinned within a tensioner 68 on the end of the extrusion arm 14. Cable 42 extends around pulley 66 and returns to the gripper assembly so that the cable in effect is double in length. An access door 70 is located on the end of the extrusion arm 14 for access to tensioner 68 in order to adjust the horizontal position of pulley 66 to adjust the tension of cable 42.

The gripper pivot 26 is moved from its open position 26' to its closed or gripping position by a pulley 72 positioned on a plunger 74 located on the end of a push rod 76. The push rod pushes the plunger downwardly engaging pulley 72 on the cable extending between pulleys 64 and 62. Pulley 72 forces the cable downwardly between pulleys 62 and 64 thereby tensioning the cable. The tension placed on cable 42 is translated along the cable to the gripper pivot pulling it downward to its closed position thereby gripping a printed circuit board. To release the printed circuit board the plunger is retracted removing the tension from the cable thereby returning the gripper pivot to the open position 26'.

As shown in FIG. 1 the plunger and push rod are actuated by an air cylinder 78. The push rod is pinned to a push rod nut 80 which is internally threaded for receiving the threaded end of the air cylinder rod 82. The air cylinder rod and the push rod nut are located within a cylinder mount 84.

The plunger 74 and the threaded end of push rod 76 are positioned within a robot mount 86 which is pinned to the upper portion 48 of clamping block 16 by dowel pins 88. The robot mount 86 is attached to the lower portion of a robot 90 which travels on a threaded shaft 92 for moving the entire loading apparatus 10 vertically as well as rotating the apparatus from the queueing station to the tester.

In operation the printed circuit board loading apparatus of the present invention operates by first releasing the locking lever 52 to adjust the length of the extrusion arm to accommodate the distance from the queueing station for the circuit boards and the tester. Once the appropriate length is determined, the locking lever is closed, securely positioning the extrusion arm within the clamping block 16. The robot then adjusts the vertical height of the loading assembly along the threaded shaft 72 with respect to the queueing station. The air cylinder is energized, pushing the plunger 74 against the cable 42 thereby closing the gripper pivot 26 so that the finger element 36 engages a printed circuit board against the shovel 22 along a single edge of the printed circuit board. The robot then rotates the loading apparatus to the tester and the air cylinder 78 retracts the push rod 76 removing the tension from cable 42. The gripper pivot opens removing the finger element 36 from the circuit board. By gripping the printed circuit board along a single edge, the loading apparatus is able to load any size or shaped circuit board. The entire operation of loading circuit board from a queueing station to the testing apparatus can be fully automated with the loading apparatus of the present invention.

What is claimed is:

1. An apparatus for loading printed circuit boards into an electronic test analyzer comprising:

an adjustable arm having means for locking the arm in a fixed position;

means positioned on an end of the arm for gripping at least one edge of the printed circuit board;

wherein the locking means is a clamping block having an upper portion positioned on an upper surface of the arm and an axially aligned lower portion positioned on a lower surface of the arm, the clamping block further having a locking lever for selectively clamping the upper portion and the lower portion to the arm;

wherein the gripping means is a housing having a shovel and a spring biased finger element for holding the printed circuit board; and means for actuating the gripping means between an open position and a gripping position.

2. The apparatus of claim 1 wherein the means for actuating the gripping means between an open position and a gripping position is a cable extending from the finger element along the arm to the clamping block, and a means for applying a force to the cable sufficient to move the spring biased finger element against the edge of the printed circuit board.

3. The apparatus of claim 2 wherein the means for applying a force to the cable is a pulley positioned on a plunger, the plunger is attached to a push rod which is actuated by a cylinder thereby pushing the pulley downwardly on the cable.

4. The apparatus of claim 3 wherein the plunger passes through the clamping block.

5. An apparatus for loading a printed circuit board into an electronic test analyzer comprising:

an adjustable arm;

a gripper assembly located at an end of the arm for engaging at least one edge of a printed circuit board;

wherein the gripping means is a housing having a shovel and a spring biased finger element for holding the printed circuit board;

a clamping block positioned along the length of the arm having a locking lever for adjustably positioning the arm;

a cable extending along the length of the arm and connected to the gripper assembly; and means for applying a force to the cable for actuating the gripper between an open position and a closed position;

wherein the clamping block includes an upper portion positioned on an upper surface of the arm and an axially aligned lower portion positioned on a lower surface of the arm, and wherein the locking lever is positioned on an upper surface of the upper portion for blocking the clamping block to the arm.

6. The apparatus of claim 5 wherein the means for applying the force to the cable is a pulley positioned on a plunger, the plunger is attached to a push rod which is actuated by a cylinder thereby pushing the pulley downwardly on the cable.

7. The apparatus of claim 6 wherein the plunger passes through the clamping block.

* * * * *